United States Patent
Ishii et al.

(10) Patent No.: US 12,058,819 B2
(45) Date of Patent: Aug. 6, 2024

(54) MULTILAYER BODY

(71) Applicant: MITSUI MINING & SMELTING CO., LTD., Tokyo (JP)

(72) Inventors: Rintaro Ishii, Ageo (JP); Takenori Yanai, Ageo (JP); Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 575 days.

(21) Appl. No.: 17/292,492

(22) PCT Filed: Nov. 14, 2019

(86) PCT No.: PCT/JP2019/044663
§ 371 (c)(1),
(2) Date: May 10, 2021

(87) PCT Pub. No.: WO2020/105535
PCT Pub. Date: May 28, 2020

(65) Prior Publication Data
US 2022/0022326 A1     Jan. 20, 2022

(30) Foreign Application Priority Data

Nov. 20, 2018 (JP) .................................. 2018-217756
Jun. 26, 2019 (JP) .................................. 2019-118303

(51) Int. Cl.
*H05K 3/46* (2006.01)
*B32B 9/00* (2006.01)
(Continued)

(52) U.S. Cl.
CPC .......... *H05K 3/4652* (2013.01); *B32B 9/007* (2013.01); *B32B 9/041* (2013.01); *B32B 15/043* (2013.01);
(Continued)

(58) Field of Classification Search
None
See application file for complete search history.

(56) References Cited

U.S. PATENT DOCUMENTS

| 6,544,664 B1 * | 4/2003 | Takahashi ............ H05K 3/388 204/192.1 |
| 2004/0038049 A1 | 2/2004 | Suzuki et al. |
| 2019/0029125 A1 | 1/2019 | Matsuura |

FOREIGN PATENT DOCUMENTS

| JP | 2005-101137 | 4/2005 |
| JP | 2006-22406 | 1/2006 |

(Continued)

OTHER PUBLICATIONS

Nagatani—JP 2007-307767 A—PCT D3+IDS—MT—copper foil w-carrier foil—2007 (Year: 2007).*

(Continued)

*Primary Examiner* — John Vincent Lawler
(74) *Attorney, Agent, or Firm* — GREENBLUM & BERNSTEIN, P.L.C.

(57) ABSTRACT

There is provided a laminate in which a decrease in the release function of a release layer can be suppressed even when the laminate is heat-treated under either temperature condition of low temperature and high temperature. This laminate includes a carrier; an adhesion layer on the carrier and containing a metal $M^1$ having a negative standard electrode potential; a release-assisting layer on a surface of the adhesion layer opposite to the carrier and containing a metal $M^2$ ($M^2$ is a metal other than an alkali metal and an alkaline earth metal); a release layer on a surface of the release-assisting layer opposite to the adhesion layer; and a metal layer on a surface of the release layer opposite to the release-assisting layer, and $T_2/T_1$, a ratio of a thickness of (Continued)

the release-assisting layer, $T_2$, to a thickness of the adhesion layer, $T_1$, is more than 1 and 20 or less.

3 Claims, 1 Drawing Sheet

(51) Int. Cl.
  *B32B 9/04* (2006.01)
  *B32B 15/04* (2006.01)
  *H05K 1/09* (2006.01)
  *H05K 3/38* (2006.01)
(52) U.S. Cl.
  CPC .............. *H05K 1/09* (2013.01); *H05K 3/388* (2013.01); *B32B 2307/748* (2013.01); *B32B 2457/08* (2013.01); *H05K 2201/0355* (2013.01)

(56) References Cited

FOREIGN PATENT DOCUMENTS

| | | | | |
|---|---|---|---|---|
| JP | 2007-307767 | | 11/2007 | |
| JP | 2007/307767 A | * | 11/2007 | ............. B32B 15/04 |
| JP | 5859155 | | 2/2016 | |
| JP | 2016/168687 A | * | 9/2016 | ............. B32B 15/01 |
| JP | 2017-228693 | | 12/2017 | |
| WO | 2017/149811 | | 9/2017 | |
| WO | WO 2017/149811 | * | 9/2017 | ............. B32B 15/04 |
| WO | WO 2017/150284 A1 | * | 9/2017 | ............. B32B 15/04 |

OTHER PUBLICATIONS

Oshiro—JP 2016-168687 A—sis PCT D2+IDS—MT—composite metal foil—2016 (Year: 2016).*
Matsuura—WO 2017-149811 A1—PCT D1—MT—copper foil w-carrier—2017 (Year: 2017).*
Matsuura—WO 2017-150284 A1—MT—copper foil w-carrier+ intermediate layer+peelable+copper layer—2017 (Year: 2017).*
PTable.com—Periodic Table—Nov. 20, 2023 (Year: 2023).*
Roy.Soc.Chem.—Copper—Element information, properties and uses—Nov. 20, 2023 (Year: 2023).*
Harvey—standard reduction potentials by element—chem.libretexts.org—accessed Nov. 20, 2023 (Year: 2023).*

* cited by examiner

MULTILAYER BODY

TECHNICAL FIELD

The present disclosure relates to a laminate comprising a carrier, a release layer, a metal layer, and the like (for example, a carrier-attached copper foil).

BACKGROUND ART

In recent years, the multilayering of printed wiring boards has been widely performed in order to increase the mounting density of the printed wiring boards for miniaturization. Such multilayer printed wiring boards are utilized in many portable electronic apparatuses for the purpose of weight reduction and miniaturization. Further reduction of the thicknesses of interlayer insulating layers, and still more weight reduction as wiring boards are required of these multilayer printed wiring boards.

As a technique for satisfying such requirements, a method for manufacturing a multilayer printed wiring board using a coreless build-up method is adopted. The coreless build-up method is a method of alternately laminating (building up) insulating layers and wiring layers for multilayering, without using a so-called core substrate. For the coreless build-up method, it is proposed to use a laminate comprising a metal layer on a carrier to which a release function is provided by a release layer or the like for easy release between a support and a multilayer printed wiring board. For example, Patent Literature 1 discloses a method for manufacturing a package substrate for semiconductor device mounting, comprising using a carrier-attached copper foil as a laminate, affixing an insulating resin layer to the carrier surface of this carrier-attached copper foil to form a support, forming a first wiring conductor on the superthin copper layer side of the carrier-attached copper foil by steps such as photoresist processing, pattern electrolytic copper plating, and resist removal, then laminating an insulating material, and performing hot pressing and the like to form a build-up wiring layer, releasing the carrier-attached supporting substrate, and removing the superthin copper layer.

In such a process for manufacturing a printed wiring board, hot pressing is performed when an insulating material is laminated. In this respect, it is known that with the heating of hot pressing, the release strength between the carrier and the metal layer increases, and the releasability is lost. Several laminates that can address such a problem are proposed. For example, Patent Literature 2 discloses a carrier-attached copper foil comprising a carrier, a carbon layer as a bonding interface layer, and a copper foil in order, and it is described that even after heating at a high temperature of more than 180° C., easy release between the carrier foil and the copper foil is possible. Patent Literature 3 discloses a carrier-attached copper foil obtained by laminating a release layer such as a chromium layer, a diffusion-preventing layer such as a nickel layer, and an electrode-posited copper plating layer in this order on a surface of a carrier, and it is described that the carrier foil can be easily released from a copper-clad laminate manufactured by casting or thermocompression bonding at high temperature.

It has also been recently proposed to form a metal layer such as a superthin copper layer by a physical vapor deposition (PVD) method such as sputtering in order to achieve further reduction of the thickness of a metal layer in a laminate. For example, Patent Literature 4 discloses a carrier-attached copper foil comprising a carrier, an adhesion metal layer, a release-assisting layer, a release layer, and a superthin copper layer in order, and it is described that the adhesion metal layer, the release-assisting layer, the release layer, and the superthin copper layer are formed by sputtering. In addition, in this literature, it is stated that the release layer is preferably a carbon layer.

CITATION LIST

Patent Literature

Patent Literature 1: JP2005-101137A
Patent Literature 2: JP2007-307767A
Patent Literature 3: JP2006-22406A
Patent Literature 4: WO2017/149811

SUMMARY OF INVENTION

For a laminate comprising a carrier, an adhesion layer, a release-assisting layer, a release layer, and a metal layer in order, as disclosed in Patent Literature 4, use in a wide range of fields is studied. Examples of specific applications of the laminate include applications as a substrate for circuit formation. In such a laminate, various material systems are used according to its application. On the other hand, with the diversification of the material systems used for the laminate, the heat treatment temperature region in the process for manufacturing the laminate also widens. However, for the release layer constituting the laminate, the adapted temperature region tends to be relatively narrow from the viewpoint of a release function. When the laminate is subjected to processing at a heating temperature outside this adapted temperature region, there are cases where the release layer cannot exhibit the desired release function. Specifically, for a release layer adapted to heat treatment at low temperature, for example, about 240° C., the release function may decrease by heat treatment at high temperature, for example, about 340° C. On the other hand, for a release layer adapted to heat treatment at high temperature, the release function may decrease by heat treatment at low temperature. In this respect, maintaining the release function, for example, by adjusting the thickness of the release layer itself is also considered, but it is difficult to maintain a sufficient release function to be adapted to heat treatment in a wide temperature region from low temperature to high temperature.

The present inventors have now discovered that by controlling the ratio of the thicknesses of an adhesion layer and a release-assisting layer within a particular range in a laminate in which the adhesion layer, the release-assisting layer, a release layer, and a metal layer are provided in order on a carrier, it is possible to suppress a decrease in the release function of the release layer even when the laminate is heat-treated under either temperature condition of low temperature and high temperature.

Therefore, it is an object of the present disclosure to provide a laminate in which a decrease in the release function of a release layer can be suppressed even when the laminate is heat-treated under either temperature condition of low temperature and high temperature.

According to an aspect of the present invention, there is provided a laminate comprising:
a carrier;
an adhesion layer provided on the carrier and comprising a metal $M^1$ having a negative standard electrode potential;
a release-assisting layer provided on a surface of the adhesion layer opposite to the carrier and comprising a metal $M^2$, wherein the $M^2$ is a metal other than an alkali metal and an alkaline earth metal;

a release layer provided on a surface of the release-assisting layer opposite to the adhesion layer; and a metal layer provided on a surface of the release layer opposite to the release-assisting layer, wherein $T_2/T_1$, a ratio of a thickness of the release-assisting layer, $T_2$, to a thickness of the adhesion layer, $T_1$, is more than 1 and 20 or less.

DESCRIPTION OF EMBODIMENT

Laminate

Figure 1:
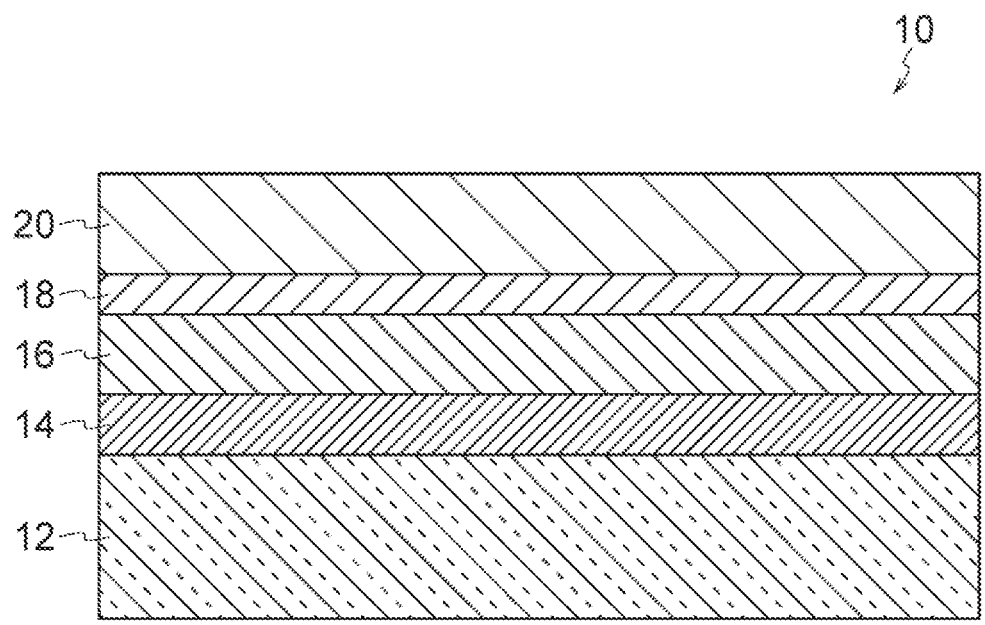
FIG. 1 is a schematic cross-sectional view showing one example of the laminate of the present disclosure.

One example of the laminate of the present disclosure is schematically shown in FIG. 1. As shown in FIG. 1, the laminate 10 of the present disclosure comprises a carrier 12, an adhesion layer 14, a release-assisting layer 16, a release layer 18, and a metal layer 20 in this order. The adhesion layer 14 is a layer comprising a metal $M^1$ having a negative standard electrode potential and is provided on the carrier 12. The release-assisting layer 16 is a layer comprising a metal $M^2$ and is provided on the surface of the adhesion layer 14 opposite to the carrier 12. $M^2$ is a metal other than an alkali metal and an alkaline earth metal. $M^1$ and $M^2$ are preferably different metals from each other. The release layer 18 is provided on the surface of the release-assisting layer 16 opposite to the adhesion layer 14. The metal layer 20 is provided on the surface of the release layer 18 opposite to the release-assisting layer 16. In the laminate 10 of the present disclosure, $T_2/T_1$, the ratio of the thickness of the release-assisting layer 16, $T_2$, to the thickness of the adhesion layer 14, $T_1$, is more than 1 and 20 or less. The metal layer 20 in the laminate 10 may be a single layer composed of one layer, or a multilayer composed of two or more layers, as desired. The laminate 10 of the present disclosure may comprise the above-described various types of layers in order on both surfaces of the carrier 12 so as to be vertically symmetrical. The laminate 10 of the present disclosure is used in all applications and preferably used particularly as a carrier-attached copper foil for printed wiring board manufacture.

According to the present disclosure, by controlling the ratio of the thicknesses of the adhesion layer 14 and the release-assisting layer 16 within the particular range in the laminate 10 in which the adhesion layer 14, the release-assisting layer 16, the release layer 18, and the metal layer 20 are provided in order on the carrier 12, it is possible to suppress a decrease in the release function of the release layer 18 even when the laminate 10 is heat-treated under either temperature condition of low temperature and high temperature. Specifically, this is as follows.

Figure 2:
FIG. 2 is a schematic cross-sectional view for explaining a state after low temperature heating for a conventional laminate comprising a release layer for high temperature adaptation.

First, as described above, it is assumed that a laminate is subjected to heat treatment in a wide temperature region. In other words, for a laminate, various material systems are used according to its application, and with the diversification of the material systems used, the heat treatment temperature region in the process for manufacturing the laminate also widens. In addition, it is assumed that also in a process for manufacturing a product fabricated using a laminate, heat treatment is performed in a wide temperature region. For example, in a process for manufacturing a multilayer printed wiring board, there are cases where an insulating material is laminated on a laminate used as a carrier-attached copper foil, and hot pressing is performed. The processing temperature of this hot pressing depends on the curing temperature of the laminated insulating material, and therefore the temperature differs greatly depending on the type of the insulating material. On the other hand, for a release layer in a conventional laminate, the adapted temperature region tends to be relatively narrow from the viewpoint of a release function. Here, for example, when a laminate is used as a carrier-attached copper foil used for the manufacture of a printed wiring board, techniques using an organic release layer using an organic component such as a nitrogen-containing organic compound or a carboxylic acid, or an inorganic release layer such as a carbon layer or a chromium layer as disclosed in Patent Literatures 2 and 3 are proposed as the release layer in the laminate. However, these release layers are designed for low temperature, for example, 240° C., or for high temperature, for example, 340° C., and the suitable use temperature is limited. Therefore, when a laminate comprising a release layer designed for low temperature is heat-treated at low temperature, a state in which the carrier and the metal layer can be released is maintained. But when the laminate is heat-treated at high temperature, problems, such as an increase in release strength causing difficulty in releasing the carrier and the metal layer, can occur. When a laminate comprising a release layer designed for high temperature is heat-treated at high temperature, a state in which the carrier and the metal layer can be released is maintained. But when the laminate is heat-treated at low temperature, problems, such as the occurrence of unintended lifting between the carrier 112 and metal layer 120 of a laminate 110, as shown in FIG. 2, can occur. In this manner, conventional laminates are designed so that the desired release strength is achieved when heat treatment is performed under either temperature condition of low temperature or high temperature. The conventional laminates are not intended to maintain moderate release strength between the carrier and the metal layer when heat treatment is performed under wide temperature conditions, for example, from low temperature to high temperature. For this problem, maintaining the release function, for example, by adjusting the thickness of the release layer itself is also considered, but it is difficult to provide a sufficient release function when performing heat treatment in a wide temperature region, for example, 240° C. or more and 340° C. or less.

The present inventors have paid attention to such a point and studied the release function of the release layer after heat treatment is performed under wide temperature conditions from low temperature to high temperature. As a result, the present inventors have newly found that the ratio of the thicknesses of the adhesion layer and the release-assisting layer interposed between the carrier and the release layer influences releasability, and discovered that by controlling this ratio of the thicknesses within the above-described particular range, a decrease in the release function of the release layer can be suppressed even when heat treatment is performed under wide temperature conditions of low temperature and high temperature. Thus, the present inventors have arrived at the present disclosure. The mechanism by which the ratio of the thicknesses of the adhesion layer and the release-assisting layer influences releasability is not necessarily certain but is considered to be due to the fact that by changing the above ratio of the thicknesses, changes occur in the diffusion behavior of the elements constituting the layers of the laminate during heating.

Therefore, for the laminate 10 of the present disclosure, when a thermal history of pressing at a pressure of 30 kgf/cm² under any temperature condition of 240° C. or more and 340° C. or less for 2 hours is given to the laminate 10, the release strength between the release layer 18 and the release-assisting layer 16 is preferably within the desired range. The above release strength is specifically, for example, preferably 0.5 gf/cm or more, especially preferably 1 gf/cm or more, and particularly preferably 3 gf/cm or more. On the other hand, the above release strength is, for example, preferably less than 200 gf/cm, especially preferably less than 100 gf/cm, and particularly preferably less than 30 gf/cm. More specifically, in all of the case where a thermal history of pressing at a pressure of 30 kgf/cm² at 240° C. for 2 hours is given to the laminate 10, the case where a thermal history of pressing at a pressure of 30 kgf/cm² at 260° C. for 2 hours is given to the laminate 10, the case where a thermal history of pressing at a pressure of 30 kgf/cm² at 280° C. for 2 hours is given to the laminate 10, the case where a thermal history of pressing at a pressure of 30 kgf/cm² at 320° C. for 2 hours is given to the laminate 10, and the case where a thermal history of pressing at a pressure of 30 kgf/cm² at 340° C. for 2 hours is given to the laminate 10, the release strength between the release layer 18 and the release-assisting layer 16 is preferably in the above-described range. When the release strength is within the above range, good release can be possible in the release step while the predetermined release strength is maintained. This release strength is a value measured in accordance with JIS C6481-1996 as mentioned in Examples described later.

From the viewpoint of satisfying the above release strength, in the laminate 10, $T_2/T_1$, the ratio of the thickness of the release-assisting layer 16, $T_2$, to the thickness of the adhesion layer 14, $T_1$, is more than 1 and 20 or less. Especially, $T_2/T_1$ is, for example, preferably 1.5 or more, further preferably 2 or more, and even more preferably 2.5 or more. On the other hand, $T_2/T_1$ is, for example, preferably 15 or less, further preferably 10 or less, and even more preferably 6 or less. The thickness of the adhesion layer 14, $T_1$, is, for example, preferably 10 nm or more, further preferably 20 nm or more, even more preferably 30 nm or more, and still more preferably 40 nm or more. On the other hand, the thickness of the adhesion layer 14, $T_1$, is, for example, preferably 1000 nm or less, further preferably 500 nm or less, even more preferably 300 nm or less, and still more preferably 100 nm or less. The thickness of the release-assisting layer 16, $T_2$, is, for example, preferably 50 nm or more, further preferably more than 100 nm, and even more preferably 150 nm or more. On the other hand, the thickness of the release-assisting layer 16, $T_2$, is, for example, preferably 1000 nm or less, further preferably 500 nm or less, and even more preferably 300 nm or less. These thicknesses can be measured by analyzing a layer cross section by a transmission electron microscope-energy dispersive X-ray spectrometer (TEM-EDX).

The adhesion layer 14 comprises the metal $M^1$ having a negative standard electrode potential in terms of ensuring adhesion to the carrier 12. Examples of preferred $M^1$ include titanium, chromium, nickel, cobalt, aluminum, molybdenum, and combinations thereof (for example, alloys and intermetallic compounds), more preferably titanium, nickel, cobalt, aluminum, molybdenum, and combinations thereof, further preferably titanium, nickel, aluminum, molybdenum, and combinations thereof, particularly preferably titanium, nickel, molybdenum, and combinations thereof, and most preferably titanium. The adhesion layer 14 may comprise an element other than $M^1$ in a range that does not impair the adhesion to the carrier 12. In the above respect, the content of $M^1$ in the adhesion layer 14 is, for example, preferably 50 atomic % or more, more preferably 60 atomic % or more, further preferably 70 atomic % or more, even more preferably 80 atomic % or more, and still more preferably 90 atomic % or more. On the other hand, the content of $M^1$ in the adhesion layer 14 can be, for example, 100 atomic % or less. The metal constituting the adhesion layer 14 may comprise unavoidable impurities due to the raw material component, the film formation step, and the like. In the case of exposure to the air after the film formation of the adhesion layer 14, the presence of oxygen incorporated due to the exposure is allowed, which is not particularly limited. The adhesion layer 14 is preferably a layer formed by a physical vapor deposition (PVD) method, more preferably a layer formed by sputtering. The adhesion layer 14 is particularly preferably a layer formed by a magnetron sputtering method using a metal target, in terms of being able to improve the uniformity of film thickness distribution.

The release-assisting layer 16 comprises the metal $M^2$ other than an alkali metal and an alkaline earth metal in terms of controlling the release strength between the release-assisting layer 16 and the release layer 18 at the desired value. Examples of preferred $M^2$ include copper, silver, tin, zinc, titanium, aluminum, niobium, zirconium, tungsten, tantalum, molybdenum, and combinations thereof (for example, alloys and intermetallic compounds), more preferably copper, silver, tin, zinc, titanium, aluminum, molybdenum, and combinations thereof, further preferably copper, silver, titanium, aluminum, molybdenum, and combinations thereof, particularly preferably copper, silver, aluminum, and combinations thereof, and most preferably copper. The release-assisting layer 16 may comprise an element other than $M^2$ in a range that does not impair the releasability of the carrier 12. In the above respect, the content of $M^2$ in the release-assisting layer 16 is, for example, preferably 50 atomic % or more, more preferably 60 atomic % or more, further preferably 70 atomic % or more, even more preferably 80 atomic % or more, and still more preferably 90 atomic % or more. On the other hand, the content of $M^2$ in the release-assisting layer 16 can be, for example, 100 atomic % or less. The metal constituting the release-assisting layer 16 may comprise unavoidable impurities due to the raw material component, the film formation step, and the like. In the case of exposure to the air after the film formation of the release-assisting layer 16, the presence of oxygen incorporated due to the exposure is allowed, which is not particularly limited. The release-assisting layer 16 is preferably a layer formed by a physical vapor deposition (PVD) method, more preferably a layer formed by sputtering. The release-assisting layer 16 is particularly preferably a layer formed by a magnetron sputtering method using a metal target, in terms of being able to improve the uniformity of film thickness distribution.

Examples of a preferred combination of $M^1$ and $M^2$ include a combination in which $M^1$ is titanium, nickel, aluminum, or molybdenum, and $M^2$ is copper, silver, titanium, aluminum, or molybdenum. Examples of a more preferred combination include a combination in which $M^1$ is titanium, nickel, or molybdenum, and $M^2$ is copper, silver, or aluminum. Examples of a particularly preferred combination include a combination in which $M^1$ is titanium, and $M^2$ is copper. Thus, the above-described desired release strength is still more easily provided to the laminate 10.

The material of the carrier 12 may be any of glass, ceramic, a resin, and a metal and may be appropriately selected according to the application of the laminate 10. The form of the carrier 12 may be any of a sheet, a film, a plate, and a foil. The carrier 12 may be a laminate of these sheets, films, plates, foils, and the like. For example, the carrier 12 may be one that can function as a support having rigidity, such as a glass plate, a ceramic plate, or a metal plate, or may be in the form of having no rigidity, such as a metal foil or a resin film. Preferred examples of the metal of the carrier 12 include copper, titanium, nickel, stainless steel, and aluminum. Preferred examples of the ceramic include alumina, zirconia, silicon nitride, aluminum nitride, and other various types of fine ceramics. Preferred examples of the resin include polyethylene terephthalate (PET), polyethylene naphthalate (PEN), polyamides, polyimides, nylons, liquid crystal polymers, polyetheretherketone (PEEK), polyamide-imides, polyethersulfone, polyphenylene sulfide, polytetrafluoroethylene (PTFE), and ethylene tetrafluoroethylene (ETFE). Especially, a material having a coefficient of thermal expansion (CTE) of less than 25 ppm/K, typically 1.0 ppm/K or more and 23 ppm/K or less, is preferred from the viewpoint of preventing the warpage of a coreless support accompanying heating when mounting an electronic device. Examples of such a material particularly include low thermal expansion resins such as polyimides and liquid crystal polymers, glass, and ceramic. From the viewpoint of handleability and ensuring flatness during chip mounting, the Vickers hardness of the carrier 12 is, for example, preferably 100 HV or more, more preferably 150 HV or more. On the other hand, the Vickers hardness of the carrier 12 can be, for example, 2500 HV or less. As a material satisfying these characteristics, the carrier 12 is preferably composed of a resin film, glass, or ceramic, especially preferably glass or ceramic, and particularly preferably glass. Examples of the carrier 12 composed of glass include a glass sheet. When glass is used as the carrier 12, advantages are that it is lightweight, has a low coefficient of thermal expansion, has high insulating properties, and is rigid and has a flat surface and therefore the surface of the metal layer 20 can be extremely smoothed. When the carrier 12 is glass, it has various advantages by using the laminate 10 as a carrier-attached copper foil for printed wiring board manufacture. For example, the advantages are that when a wiring layer on a coreless support surface is formed, and then image inspection is performed, the visibility contrast with the copper plating is excellent, that the carrier 12 has surface flatness, so-called coplanarity, advantageous during electronic device mounting, that the carrier 12 has chemical resistance in desmear and various types of plating steps in a printed wiring board manufacturing process, and that a chemical separation method can be adopted during build-up layer-attached laminate separation. Preferred examples of the glass constituting the carrier 12 include quartz glass, borosilicate glass, alkali-free glass, soda lime glass, aluminosilicate glass, and combinations thereof, and particularly preferably include alkali-free glass. The alkali-free glass refers to glass containing substantially no alkali metals that comprises silicon dioxide, aluminum oxide, boron oxide, and alkaline earth metal oxides such as calcium oxide and barium oxide as main components and further contains boric acid. An advantage of this alkali-free glass is that it has a low coefficient of thermal expansion, for example, in the range of 3 ppm/K or more and 5 ppm/K or less, and is stable in a wide temperature zone from 0° C. to 350° C., and therefore when a semiconductor chip is mounted as an electronic device, the warpage of the glass can be minimized. The thickness of the carrier 12 is, for example, preferably 100 μm or more, more preferably 300 μm or more, and further preferably 400 μm or more. On the other hand, the thickness of the carrier 12 is, for example, preferably 2000 μm or less, more preferably 1800 μm or less, and further preferably 1100 μm. When the thickness is within such a range, the thinning of a printed wiring board, and the reduction of warpage that occurs during electronic component mounting can be achieved while suitable strength that does not hinder handling is ensured.

The arithmetic mean roughness Ra of the surface of the carrier 12 on the adhesion layer 14 side is, for example, preferably 0.1 nm or more, more preferably 0.5 nm or more, further preferably 1.0 nm or more, even more preferably 1.5 nm or more, and still more preferably 2.0 nm or more. On the other hand, the arithmetic mean roughness Ra of the surface of the carrier 12 on the adhesion layer 14 side is, for example, preferably 70 nm or less, more preferably 60 nm or less, further preferably 50 nm or less, even more preferably 40 nm or less, and still more preferably 30 nm or less. By decreasing the above arithmetic mean roughness, good arithmetic mean roughness Ra can be achieved on the surface of the metal layer 20 opposite to the release layer 18, that is, the outside surface of the metal layer 20. This can be suitable, for example, for forming a highly fine wiring pattern in a printed wiring board manufactured using the laminate 10. Here, the highly fine wiring pattern refers to a wiring pattern designed, for example, with a line/space (L/S) of 13 μm or less/13 μm or less, specifically within the range of 2 μm/2 μm or more and 12 μm/12 μm or less. The above arithmetic mean roughness Ra can be measured by a method in accordance with JIS B 0601-2001.

The release layer 18 is a layer that allows the release of the carrier 12. The release layer 18 may be either of an organic release layer and an inorganic release layer or may be a composite release layer of an organic release layer and an inorganic release layer. Examples of the organic component used for the organic release layer include nitrogen-containing organic compounds, sulfur-containing organic compounds, and carboxylic acids. Examples of the nitrogen-containing organic compounds include triazole compounds and imidazole compounds. On the other hand, examples of the inorganic component used for the inorganic release layer include metal oxides of at least one or more of nickel, molybdenum, cobalt, chromium, iron, titanium, tungsten, phosphorus, and zinc, and carbon. The release layer 18 may be a layer comprising both a metal oxide and carbon. Among these, particularly, the release layer 18 is preferably a layer comprising carbon in terms of the ease of release, film-forming properties, and the like, more preferably a layer mainly comprising carbon, and further preferably a layer mainly composed of carbon or a hydrocarbon, and is particularly preferably composed of amorphous carbon, a hard carbon film. In this case, in the release layer 18 (that is, the carbon layer), the carbon concentration measured by XPS is, for example, preferably 60 atomic % or more, more preferably 70 atomic % or more, further preferably 80 atomic % or more, and particularly preferably 85 atomic % or more. The upper limit value of the carbon concentration is not particularly limited and may be 100 atomic % but is practically 98 atomic % or less. The release layer 18, particularly a carbon layer or the like, may comprise unavoidable impurities, for example, oxygen, carbon, and hydrogen derived from the surrounding environment such as the atmosphere. In the release layer 18, particularly a carbon layer or the like, metal atoms may be incorporated due to the film formation method of the metal layer 20. Carbon has relatively low interdiffusivity with the carrier and reactivity. Therefore, even if the laminate 10 is subjected to pressing at high temperature, or the like, the formation of metallic bonds between the metal layer and the bonding interface due to high temperature heating can be suppressed to maintain a state in which the release and removal of the carrier is easy. This release layer 18 is also preferably a layer formed by a vapor phase method such as sputtering in terms of suppressing excessive impurities in the amorphous carbon, and in terms of continuous productivity with the film formation of the above-described adhesion layer 14 and/or release-assisting layer 16, and the like. The thickness of the release layer 18 is, for example, preferably 1 nm or more and preferably 20 nm or less or 10 nm or less. This thickness can be measured by analyzing a layer cross section by a transmission electron microscope-energy dispersive X-ray spectrometer (TEM-EDX).

The metal layer 20 is a layer composed of a metal. The metal layer 20 may have a one-layer configuration or a configuration of two or more layers. When the metal layer 20 is composed of two or more layers, the metal layer 20 can have a configuration in which metal layers from a first metal layer to an mth metal layer (m is an integer of 2 or more) are laminated in order on the surface of the release layer 18 opposite to the release-assisting layer 16. An example in which the metal layer 20 is composed of two layers, a first metal layer and a second metal layer, will be described below.

The first metal layer is not particularly limited as long as it provides the desired functions such as an etching stopper function and an antireflection function to the laminate 10. Preferred examples of the metal constituting the first metal layer include titanium, aluminum, niobium, zirconium, chromium, tungsten, tantalum, cobalt, silver, nickel, molybdenum, and combinations thereof, more preferably titanium, zirconium, aluminum, chromium, tungsten, nickel, molybdenum, and combinations thereof, further preferably titanium, aluminum, chromium, nickel, molybdenum, and combinations thereof, and particularly preferably titanium, molybdenum and combinations thereof. These elements have the property of not dissolving in flash etchants (for example, copper flash etchants) and, as a result, can exhibit excellent chemical resistance to flash etchants. Therefore, the first metal layer is a layer less likely to be etched with a flash etchant than the second metal layer described later, and therefore can function as an etching stopper layer. In addition, the above-described metal constituting the first metal layer also has the function of preventing the reflection of light, and therefore the first metal layer can also function as an antireflection layer for improving visibility in image inspection (for example, automatic image inspection (AOI)). The first metal layer may be a pure metal or an alloy. The metal constituting the first metal layer may comprise unavoidable impurities due to the raw material component, the film formation step, and the like. The upper limit of the content of the above metal is not particularly limited and may be 100 atomic %. The first metal layer is preferably a layer formed by a physical vapor deposition (PVD) method, more preferably a layer formed by sputtering. The thickness of the first metal layer is, for example, preferably 1 nm or more, further preferably 10 nm or more, even more preferably 30 nm or more, and still more preferably 50 nm or more. On the other hand, the thickness of the first metal layer is, for example, preferably 500 nm or less, further preferably 400 nm or less, even more preferably 300 nm or less, and still more preferably 200 nm or less. This thickness can be measured by analyzing a layer cross section by a transmission electron microscope-energy dispersive X-ray spectrometer (TEM-EDX).

Preferred examples of the metal constituting the second metal layer include the transition elements of groups 4, 5, 6, 9, 10, and 11, aluminum, and combinations thereof (for example, alloys and intermetallic compounds), more preferably copper, gold, titanium, aluminum, niobium, zirconium, chromium, tungsten, tantalum, cobalt, silver, nickel, molybdenum, and combinations thereof, further preferably copper, gold, titanium, aluminum, niobium, zirconium, cobalt, silver, nickel, molybdenum, and combinations thereof, further more preferably copper, gold, titanium, aluminum, silver, molybdenum, and combinations thereof, particularly preferably copper, gold, titanium, molybdenum, and combinations thereof, and most preferably copper. The second metal layer may be manufactured by any method and may be a metal foil formed, for example, by wet film formation methods such as an electroless metal plating method and an electrolytic metal plating method, physical vapor deposition (PVD) methods such as sputtering and vacuum deposition, chemical vapor film formation, or combinations thereof. A particularly preferred metal layer is a metal layer formed by a physical vapor deposition (PVD) method such as a sputtering method or vacuum deposition, from the viewpoint of being easily adapted to a fine pitch due to super-thinning, and most preferably a metal layer manufactured by a sputtering method. The second metal layer is preferably an unroughened metal layer. On the other hand, when the laminate 10 is used for the manufacture of a printed wiring board, secondary roughening may occur in the second metal layer by preliminary roughening, soft etching treatment, rinse treatment, or oxidation-reduction treatment as long as wiring pattern formation during printed wiring board manufacture is not hindered. The thickness of the second metal layer is, for example, preferably 10 nm or more, further preferably 20 nm or more, even more preferably 30 nm or more, still more preferably 50 nm or more, particularly preferably 70 nm or more, and most preferably 100 nm or more. On the other hand, the thickness of the second metal layer is, for example, preferably 1000 nm or less, further preferably 900 nm or less, even more preferably 700 nm or less, still more preferably 600 nm or less, particularly preferably 500 nm or less, and most preferably 400 nm or less from the viewpoint of being adapted to a fine pitch as described above. The metal layer having a thickness within such a range is preferably manufactured by a sputtering method from the viewpoint of the in-plane uniformity of film formation thickness, and productivity in the form of a sheet or a roll. This thickness is a value measured by analyzing a layer cross section by a transmission electron microscope-energy dispersive X-ray spectrometer (TEM-EDX).

For the surface of the second metal layer opposite to the first metal layer (the outside surface of the metal layer 20), the arithmetic mean roughness Ra measured in accordance with JIS B 0601-2001 is, for example, preferably 1.0 nm or more, further preferably 2.0 nm or more, even more preferably 3.0 nm or more, still more preferably 4.0 nm or more, and particularly preferably 5.0 nm or more. On the other hand, for the surface of the second metal layer opposite to the first metal layer (the outside surface of the metal layer 20), the arithmetic mean roughness Ra measured in accordance with JIS B 0601-2001 is, for example, preferably 100 nm or less, further preferably 40 nm or less, even more preferably 35 nm or less, still more preferably 30 nm or less, and particularly preferably 15 nm or less. An arithmetic mean roughness smaller in this manner can be suitable, for example, for forming a highly fine wiring pattern in a printed wiring board manufactured using the laminate 10. Here, the highly fine wiring pattern refers to a wiring pattern designed, for example, with a line/space (L/S) of 13 µm or less/13 µm or less, specifically within the range of 2 µm/2 µm or more and 12 µm/12 µm or less.

When the metal layer 20 has a one-layer configuration, the above-described second metal layer is preferably adopted as the metal layer 20 as it is. On the other hand, when the metal layer 20 has an n-layer (n is an integer of 3 or more) configuration, the first metal layer to (n−1)th layer of the metal layer 20 preferably have the configuration of the above-described first metal layer, and the outermost layer, that is, the nth metal layer, of the metal layer 20 preferably has the configuration of the above-described second metal layer.

The adhesion layer 14, the release-assisting layer 16, the release layer 18, and the metal layer 20 are all preferably physical vapor-deposited (PVD) films, that is, films formed by a physical vapor deposition (PVD) method, and more preferably sputtered films, that is, films formed by a sputtering method.

Method for Manufacturing Laminate

The laminate 10 according to the present disclosure can be manufactured by providing the carrier 12 and forming the adhesion layer 14, the release-assisting layer 16, the release layer 18, and the metal layer 20 on the carrier 12. The formation of each layer of the adhesion layer 14, the release-assisting layer 16, the release layer 18, and the metal layer 20 is preferably performed by a physical vapor deposition (PVD) method from the viewpoint of being easily adapted to a fine pitch due to super-thinning. Examples of the physical vapor deposition (PVD) method include a sputtering method, a vacuum deposition method, and an ion plating method. Especially, the sputtering method is preferably used in terms of being able to control film thickness in the wide range of 0.05 nm or more and 5000 nm or less, and in terms of being able to ensure film thickness uniformity over a wide width or area, and the like. Particularly, by forming all layers of the adhesion layer 14, the release-assisting layer 16, the release layer 18, and the metal layer 20 by the sputtering method, the manufacturing efficiency can be significantly increased. The film formation by the physical vapor deposition (PVD) method should be performed according to known conditions using a known vapor phase film formation apparatus and is not particularly limited. For example, when a sputtering method is adopted, examples of the sputtering method include various known methods such as a magnetron sputtering method, a bipolar sputtering method, and a facing target sputtering method. Especially, the magnetron sputtering method is preferred in terms of a fast film formation rate and high productivity. The sputtering method may be performed with either of DC (direct current) and RF (radio frequency) power supplies. In the sputtering method, for example, also for the target shape, a widely known plate type target can be used. Especially, a cylindrical target is desirably used from the viewpoint of target use efficiency. The film formation of each layer of the adhesion layer 14, the release-assisting layer 16, the release layer 18, and the metal layer 20 by a physical vapor deposition (PVD) method will be described below. The metal layer 20 will be described as an example of a two-layer configuration of a first metal layer and a second metal layer.

When the adhesion layer 14 is obtained by film formation by a physical vapor deposition (PVD) method, preferably a sputtering method, the above film formation is preferably performed, for example, by a magnetron sputtering method under a non-oxidizing atmosphere using a target composed of the above-described metal $M^1$ because the film thickness distribution uniformity can be improved. The purity of the target is, for example, preferably 99.9% or more. Examples of the gas used for sputtering include inert gases such as argon gas. The flow rate of argon gas can be appropriately determined according to the sputtering chamber size and the film formation conditions. From the viewpoint of suppressing the occurrence of poor operation such as abnormal discharge and poor plasma irradiation and continuously performing film formation, the pressure during the film formation is, for example, preferably 0.1 Pa or more and 20 Pa or less. This pressure range can be set by adjusting the film formation power and the flow rate of argon gas according to the apparatus structure, the capacity, the exhaust capacity of the vacuum pump, the rated capacity of the film formation power supply, and the like. The sputtering power can be, for example, 0.05 W/cm$^2$ or more and 10.0 W/cm$^2$ or less, per unit area of the target considering the film thickness uniformity of the film formation, productivity, and the like.

When the release-assisting layer 16 is obtained by film formation by a physical vapor deposition (PVD) method, preferably a sputtering method, the above film formation is preferably performed, for example, by a magnetron sputtering method under a non-oxidizing atmosphere using a target composed of the above-described metal $M^2$ because the film thickness distribution uniformity can be improved. The purity of the target is, for example, preferably 99.9% or more. Examples of the gas used for sputtering include inert gases such as argon gas. The flow rate of argon gas can be appropriately determined according to the sputtering chamber size and the film formation conditions. From the viewpoint of suppressing the occurrence of poor operation such as abnormal discharge and poor plasma irradiation and continuously performing film formation, the pressure during the film formation is, for example, preferably 0.1 Pa or more and 20 Pa or less. This pressure range can be set by adjusting the film formation power and the flow rate of argon gas according to the apparatus structure, the capacity, the exhaust capacity of the vacuum pump, the rated capacity of the film formation power supply, and the like. The sputtering power can be, for example, 0.05 W/cm$^2$ or more and 10.0 W/cm$^2$ or less, per unit area of the target considering the film thickness uniformity of the film formation, productivity, and the like.

When the release layer 18 is obtained by film formation by a physical vapor deposition (PVD) method, preferably a sputtering method, the above film formation is preferably performed, for example, under an inert atmosphere such as argon using a carbon target. The carbon target is preferably composed of graphite but may comprise unavoidable impurities, for example, oxygen, carbon, and hydrogen derived from the surrounding environment such as the atmosphere. The purity of the carbon target is, for example, preferably 99.99% or more, further preferably 99.999% or more. From the viewpoint of suppressing the occurrence of poor operation such as abnormal discharge and poor plasma irradiation and continuously performing film formation, the pressure during the film formation is, for example, preferably 0.1 Pa or more and 2.0 Pa or less. This pressure range can be set by adjusting the film formation power and the flow rate of argon gas according to the apparatus structure, the capacity, the exhaust capacity of the vacuum pump, the rated capacity of the film formation power supply, and the like. The sputtering power can be, for example, 0.05 W/cm² or more and 10.0 W/cm² or less, per unit area of the target considering the film thickness uniformity of the film formation, productivity, and the like.

When the first metal layer is formed by a physical vapor deposition (PVD) method, preferably a sputtering method, the above film formation is preferably performed, for example, by a magnetron sputtering method using a target composed of at least one metal selected from the group consisting of titanium, aluminum, niobium, zirconium, chromium, tungsten, tantalum, cobalt, silver, nickel, and molybdenum. The purity of the target is, for example, preferably 99.9% or more. Particularly, the film formation of the first metal layer by a magnetron sputtering method is preferably performed under an inert gas atmosphere such as argon. The pressure during the film formation is, for example, preferably 0.1 Pa or more, further preferably 0.2 Pa or more, and even more preferably 0.3 Pa or more. On the other hand, the pressure during the film formation is, for example, preferably 20 Pa or less, further preferably 15 Pa or less, and even more preferably 10 Pa or less. The control of the above pressure range can be performed by adjusting the film formation power and the flow rate of argon gas according to the apparatus structure, the capacity, the exhaust capacity of the vacuum pump, the rated capacity of the film formation power supply, and the like. The flow rate of argon gas can be appropriately determined according to the sputtering chamber size and the film formation conditions. The sputtering power can be, for example, 1.0 W/cm² or more and 15.0 W/cm² or less, per unit area of the target considering the film thickness uniformity of the film formation, productivity, and the like. The carrier temperature is preferably kept constant during the film formation in terms of easily obtaining a film stable in film characteristics, for example, film resistance and crystal size. The carrier temperature during the film formation is, for example, preferably 25° C. or more, further preferably 40° C. or more, and even more preferably 50° C. or more. On the other hand, the carrier temperature during the film formation is, for example, preferably 300° C. or less, further preferably 200° C. or less, and even more preferably 150° C. or less.

When the second metal layer is obtained by film formation by a physical vapor deposition (PVD) method, preferably a sputtering method, the above film formation is preferably performed, for example, under an inert atmosphere such as argon using a target composed of at least one metal selected from the group consisting of the transition elements of groups 4, 5, 6, 9, 10, and 11, and aluminum. The metal target such as a copper target is preferably composed of a metal such as metal copper but may comprise unavoidable impurities. The purity of the metal target is, for example, preferably 99.9% or more, further preferably 99.99% or more, and even more preferably 99.999% or more. In order to avoid temperature increase during the vapor phase film formation of the second metal layer, the cooling mechanism of the stage can be provided in sputtering. From the viewpoint of suppressing the occurrence of poor operation such as abnormal discharge and poor plasma irradiation and stably performing film formation, the pressure during the film formation is, for example, preferably 0.1 Pa or more and 2.0 Pa or less. This pressure range can be set by adjusting the film formation power and the flow rate of argon gas according to the apparatus structure, the capacity, the exhaust capacity of the vacuum pump, the rated capacity of the film formation power supply, and the like. The sputtering power can be, for example, 0.05 W/cm² or more and 10.0 W/cm² or less, per unit area of the target considering the film thickness uniformity of the film formation, productivity, and the like.

EXAMPLES

The present disclosure will be more specifically described by the following examples.

Example 1 (Comparison)

As shown in FIG. 1, an adhesion layer 14, a release-assisting layer 16, a release layer 18, and a metal layer 20 (a first metal layer and a second metal layer) were formed in this order on a carrier 12 to manufacture a laminate 10. The specific procedure is as follows.

(1) Provision of Carrier

A 1.1 mm thick glass sheet (material: soda lime glass, arithmetic mean roughness Ra: 0.6 nm, manufactured by Central Glass Co., Ltd.) was provided as the carrier 12.

(2) Formation of Adhesion Layer

A 100 nm thick titanium layer as the adhesion layer 14 was formed on the carrier 12 by a sputtering method. This sputtering was performed under the following conditions using the following apparatus.

Apparatus: single-wafer type magnetron sputtering apparatus (manufactured by Canon Tokki Corporation, MLS464)
Target: titanium target 8 inches (203.2 mm) in diameter (purity 99.999%)
Ultimate vacuum: less than 1×10⁻⁴ Pa
Sputtering pressure: 0.35 Pa
Sputtering power: 1000 W (3.1 W/cm²)
Temperature during film formation: 40° C.

(3) Formation of Release-Assisting Layer

A 100 nm thick copper layer as the release-assisting layer 16 was formed on the surface of the adhesion layer 14 opposite to the carrier 12 by a sputtering method. This sputtering was performed under the following conditions using the following apparatus.

Apparatus: single-wafer type DC sputtering apparatus (manufactured by Canon Tokki Corporation, MLS464)
Target: copper target 8 inches (203.2 mm) in diameter (purity 99.98%)
Ultimate vacuum: less than 1×10⁻⁴ Pa
Gas: argon gas (flow rate: 100 sccm)
Sputtering pressure: 0.35 Pa
Sputtering power: 1000 W (6.2 W/cm²)
Temperature during film formation: 40° C.

(4) Formation of Release Layer

A 6 nm thick amorphous carbon layer as the release layer 18 was formed on the surface of the release-assisting layer 16 opposite to the adhesion layer 14 by a sputtering method. This sputtering was performed under the following conditions using the following apparatus.

Apparatus: single-wafer type DC sputtering apparatus (manufactured by Canon Tokki Corporation, MLS464)
Target: carbon target 8 inches (203.2 mm) in diameter (purity 99.999%)
Ultimate vacuum: less than 1×10⁻⁴ Pa
Gas: argon gas (flow rate: 100 sccm)
Sputtering pressure: 0.35 Pa
Sputtering power: 250 W (0.7 W/cm²)
Temperature during film formation: 40° C.

(5) Formation of First Metal Layer

A 100 nm thick titanium layer as the first metal layer was formed on the surface of the release layer 18 opposite to the release-assisting layer 16 by sputtering with the following apparatus and conditions.

Apparatus: single-wafer type DC sputtering apparatus (manufactured by Canon Tokki Corporation, MLS464)
Target: titanium target 8 inches (203.2 mm) in diameter (purity 99.999%)
Carrier gas: argon gas (flow rate: 100 sccm)
Ultimate vacuum: less than $1\times10^{-4}$ Pa
Sputtering pressure: 0.35 Pa
Sputtering power: 1000 W (3.1 W/cm$^2$)

(6) Formation of Second Metal Layer

A 300 nm thick copper layer as the second metal layer was formed on the surface of the first metal layer opposite to the release layer 18 by a sputtering method. This sputtering was performed under the following conditions using the following apparatus.

Target: copper target 8 inches (203.2 mm) in diameter (purity 99.98%)
Ultimate vacuum: less than $1\times10^{-4}$ Pa
Gas: argon gas (flow rate: 100 sccm)
Sputtering pressure: 0.35 Pa
Sputtering power: 1000 W (3.1 W/cm$^2$)
Temperature during film formation: 40° C.

Examples 2 to 11

A laminate 10 was manufactured as in Example 1 except that the adhesion layer 14 and the release-assisting layer 16 were formed with thicknesses shown in Table 1, so as to satisfy $1<T_2/T_1\leq20$.

releasability evaluation sample. A plurality of releasability evaluation samples were fabricated for each example. These releasability evaluation samples were pressed at a pressure of 30 kgf/cm$^2$ at any temperature of 240° C., 260° C., 280° C., 320° C., and 340° C. as shown in Table 1 for 2 hours as a thermal history. For each releasability evaluation sample after the hot pressing, the release strength (gf/cm) when the above electrodeposited copper plating layer integrated with the metal layer 20 was released was measured in accordance with JIS C 6481-1996. At this time, the measurement width was 50 mm, and the measurement length was 20 mm. The obtained release strength (average value) was rated and evaluated by the following criteria, and cases where there was no evaluation D for all pressing temperatures were determined to be accepted, and other cases were determined to be rejected.

Evaluation A: the release strength is 3 gf/cm or more and less than 30 gf/cm

Evaluation B−: the release strength is 1 gf/cm or more and less than 3 gf/cm

Evaluation B+: the release strength is 30 gf/cm or more and less than 100 gf/cm

Evaluation C−: the release strength is 0.5 gf/cm or more and less than 1 gf/cm

Evaluation C+: the release strength is 100 gf/cm or more and less than 200 gf/cm Evaluation D: the release strength is less than 0.5 gf/cm or more than 200 gf/cm (including being impossible to release)

TABLE 1

| | Adhesion layer thickness $T_1$ (nm) | Release-assisting layer thickness $T_2$ (nm) | $T_2/T_1$ | Release strength evaluation 240° C. | 260° C. | 280° C. | 320° C. | 340° C. | Determination |
|---|---|---|---|---|---|---|---|---|---|
| Ex. 1* | 100 | 100 | 1.0 | A | A | B+ | D | C+ | Rejected |
| Ex. 2 | | 150 | 1.5 | B− | A | A | B+ | B+ | Accepted |
| Ex. 3 | | 200 | 2.0 | B− | B− | B− | B+ | B+ | Accepted |
| Ex. 4 | | 300 | 3.0 | B− | B− | B− | A | B+ | Accepted |
| Ex. 5 | 75 | 150 | 2.0 | B− | A | A | A | B+ | Accepted |
| Ex. 6 | | 200 | 2.7 | B− | B− | A | B+ | B+ | Accepted |
| Ex. 7 | | 300 | 4.0 | B− | B− | B− | A | B+ | Accepted |
| Ex. 8 | 50 | 150 | 3.0 | B− | B− | A | B+ | B+ | Accepted |
| Ex. 9 | | 200 | 4.0 | B− | B− | B− | A | B+ | Accepted |
| Ex. 10 | | 300 | 6.0 | B− | B− | B− | A | B+ | Accepted |
| Ex. 11 | 30 | 200 | 6.7 | B− | B− | A | A | B+ | Accepted |

*indicates a Comparative Example.

Evaluation

For the laminates of Examples 1 to 11, the measurement of release strength was performed as shown below. The evaluation results were as shown in Table 1. In Table 1, the thickness of the adhesion layer 14, $T_1$, the thickness of the release-assisting layer 16, $T_2$, and $T_2/T_1$ are also shown together.

<Releasability of Metal Layer>

The release strength after vacuum hot pressing as a thermal history in the laminate 10 was performed was measured. Specifically, the metal layer 20 side of the laminate 10 was subjected to 18 μm thick panel electrolytic copper plating to form a copper plating layer to provide a

The invention claimed is:

1. A laminate comprising:
a carrier;
an adhesion layer provided on the carrier and comprising titanium;
a release-assisting layer provided on a surface of the adhesion layer opposite to the carrier and comprising copper;
a release layer provided on a surface of the release-assisting layer opposite to the adhesion layer and comprising amorphous carbon; and
a metal layer provided on a surface of the release layer opposite to the release-assisting layer, wherein $T_2/T_1$, a ratio of a thickness of the release-assisting layer, $T_2$, to a thickness of the adhesion layer, $T_1$, is 1.5 or more and 6.7 or less.

2. The laminate according to claim 1, wherein when a thermal history of pressing at a pressure of 30 kgf/cm$^2$ under any temperature condition of 240° C. or more and 340° C. or less for 2 hours is given to the laminate, a release strength between the release layer and the release-assisting layer measured in accordance with JIS C6481-1996 is 1 gf/cm or more and less than 100 gf/cm.

3. The laminate according to claim 1, wherein the carrier is composed of glass or ceramic.

* * * * *